United States Patent [19]
Fujino et al.

[11] Patent Number: 5,601,649
[45] Date of Patent: *Feb. 11, 1997

[54] OXIDE SUPERCONDUCTING FILM MANUFACTURING APPARATUS

[75] Inventors: Kousou Fujino; Satoshi Takano; Noriyuki Yoshida, all of Osaka; Tsukushi Hara; Hideo Ishii, both of Chofu, all of Japan

[73] Assignee: Sumitomo Electric Industries, Ltd., Japan

[ * ] Notice: The term of this patent shall not extend beyond the expiration date of Pat. No. 5,489,338.

[21] Appl. No.: 496,564

[22] Filed: Jun. 29, 1995

Related U.S. Application Data

[63] Continuation of Ser. No. 97,789, Jul. 26, 1993, Pat. No. 5,489,338.

[30] Foreign Application Priority Data

Jul. 30, 1992 [JP] Japan ................................. 4-203859

[51] Int. Cl.⁶ ................................................... C23C 14/28
[52] U.S. Cl. ........................ 118/688; 118/50.1; 118/620; 118/690; 118/691; 204/192.24; 204/298.02; 204/298.28
[58] Field of Search ..................... 118/620, 715, 118/50, 50.1, 688, 689, 690, 691; 204/298.01, 298.02, 192.1, 192.24

[56] References Cited

U.S. PATENT DOCUMENTS 4,265,932  5/1981  Peters et al. ........................ 427/53.1
4,837,044  6/1989  Murarka et al. ........................ 427/10

OTHER PUBLICATIONS

Weimer, Appl. Phys. Lett. 52(25) 20 Jun. 1988 pp. 2171–2173.

Bauerle, Appl. Phys. A. 4: 527–542 (1989).

Primary Examiner—Jill Warden
Assistant Examiner—Jan M. Ludlow
Attorney, Agent, or Firm—Pennie & Edmonds

[57] ABSTRACT

Disclosed herein is an apparatus for manufacturing an oxide superconducting film employing laser ablation method. This apparatus has a thin film forming chamber having a laser-transparent laser entrance window, a target being provided in the thin film forming chamber and containing components of an oxide superconductor, a laser beam source for irradiating the target with a laser beam from the exterior of the thin film forming chamber through the laser entrance window, and apparatus for controlling power of the laser beam which is applied to the target for preventing the power of the laser beam, being applied to the target, from reduction by contamination of the entrance window caused by scattered particles. According to the present invention, it is possible to form an oxide superconducting film having high and uniform characteristics even if a long time is required for film formation, thereby attaining a remarkable effect in improvement of superconductivity of a large area oxide superconducting film.

5 Claims, 12 Drawing Sheets

OXIDE SUPERCONDUCTING FILM MANUFACTURING APPARATUS

This is a continuation of application Ser. No. 08/097,789, filed Jul. 26, 1993 now U.S. Pat. No. 5,489,338.

BACKGROUND OF THE INVENTION

1. Field of the Invention

The present invention relates to an oxide superconducting film manufacturing apparatus, and more particularly, it relates to an oxide superconducting film manufacturing apparatus employing laser ablation method.

2. Description of the Background Art

When a target is irradiated with a laser beam, ablation so takes in a portion irradiated with the laser beam as to scatter particles of a material forming the target in states of atoms and molecules. The as-scattered particles are deposited on a substrate which is arranged to face the target, thereby providing a thin film of the material forming the target on the substrate.

When sputtering or MBE is employed for forming an oxide superconducting thin film, the interior of a thin film forming chamber must be maintained at a high degree of vacuum in general. When laser ablation method is employed, on the other hand, the interior of such a chamber may not be maintained at a high degree of vacuum but a film can be formed under a high gaseous oxygen pressure. Further, formation of a superconducting thin film by laser ablation method with an excimer laser, for example, is watched with interest in a point that a superconducting film of high quality can be formed at a high speed since scattered particles are deposited at a high speed and the composition of the as-formed film is hardly displaced from a target composition.

In formation of a superconducting film by such laser ablation method, an oxide superconducting film manufacturing apparatus shown in FIG. 5, for example, is employed in general. Referring to FIG. 5, this oxide superconducting film manufacturing apparatus comprises a laser oscillator 1, and a thin film forming chamber 3 having a laser entrance window 2. This laser oscillator 1 is set in the exterior of the thin film forming chamber 3. The thin film forming chamber 3 is provided therein with a target 4 containing components of an oxide superconductor, and a substrate 6 which is arranged to face the target 4.

The target 4 provided in the thin film forming chamber 3 is irradiated with a laser beam which is emitted from the laser oscillator 1, through the laser entrance window 2. The target 4 contains components of an oxide superconductor. Upon such irradiation with the laser beam, particles 5 of the material forming the target 4 are scattered from the target 4, to be deposited on the substrate 6 which is arranged to face the target 4. Thus, a thin film of the material forming the target 4 is provided on the substrate 6.

In such formation of a superconducting film by laser ablation method, however, the particles are scattered from the target 4 not only toward the substrate 6 but toward the laser entrance window 2 during film formation, to adhere to the laser entrance window 2. Thus, laser transmissivity of the laser entrance window 2 is so reduced that power of the laser beam which is applied to the target 4 is reduced with time. When the laser power is thus reduced with time, it is impossible to obtain a superconducting film having high characteristics.

Particularly in formation of a large area film such as a tape wire, a long time is required for film formation and hence the as-formed tape wire is irregularized in film quality and film thickness along its longitudinal direction due to the aforementioned reduction in laser power with time. Thus, it is impossible to obtain an oxide superconducting film having high and uniform characteristics.

SUMMARY OF THE INVENTION

In order to solve the aforementioned problem, an object of the present invention is to provide an oxide superconducting film manufacturing apparatus which can prepare an oxide superconducting film having high and uniform characteristics even if film formation takes a long time.

The present invention is directed to an apparatus for manufacturing an oxide superconducting film using laser ablation method, which comprises a thin film forming chamber having a laser-transparent laser entrance window, a target being provided in the thin film forming chamber and containing components of an oxide superconductor, a laser beam source for applying a laser beam to the target from the exterior of the thin film forming chamber through the laser entrance window, and means for controlling power of the laser beam applied to the target at a constant level in order to prevent the power of the laser beam, being applied to the target, from reduction by contamination of the entrance window caused by scattered particles.

In an aspect of the present invention, a movable laser-transparent plate which is movable during film formation may be preferably provided as the control means between the laser entrance window and the target.

Such a movable laser-transparent plate may be linearly moved, rotated, or rotated with linear movement of its rotation axis. Further, the movable laser-transparent plate may be provided in the form of a sheet which is moved by a take-up supply.

In another aspect of the present invention, the control means may preferably comprise detection means for detecting intensity of light emission from a specific luminous species contained in particles which are scattered from the target during film formation, and means for controlling the power of the laser beam emitted from the laser beam source so that the intensity of light emission from the luminous species is constant during film formation in response to a light emission intensity detection output received from the detection means.

Still another preferable example of the control means may comprise first detection means for detecting intensity of light emission from a specific luminous species contained in particles scattered from the target during film formation, means for controlling the power of the laser beam emitted from the laser beam source so that the intensity of light emission from the luminous species is constant during film formation in response to a light emission intensity detection output received from the first detection means, second detection means for detecting a control limit of the control means, and means for moving the movable laser-transparent plate in response to a detection output of the second detection means.

The movable laser-transparent plate may be linearly moved, rotated, or rotated with linear movement of its rotation axis. Further, the movable laser-transparent plate may be provided in the form of a sheet which is moved by a take-up supply.

A further preferable example of the control means may comprise detection means for detecting intensity of light emission from a specific luminous species contained in particles which are scattered from the target during film formation, means for controlling the power of the laser beam emitted from the laser beam source so that the intensity of light emission from the luminous species is constant during film formation in response to a light emission intensity detection output from the detection means, and means for continuously moving the movable laser-transparent plate during film formation.

The movable laser-transparent plate may be linearly moved, rotated, or rotated with linear movement of its rotation axis. Further, the movable laser-transparent plate may be provided in the form of a sheet which is moved by a take-up supply.

According to the present invention, the power of the laser beam which is applied to the target is so controlled at a constant level that the laser beam being applied to the target is prevented from reduction in power by contamination of the entrance window caused by particles scattered during film formation. When the target is irradiated with the laser beam which is at a constant power level during film formation, a constant amount of particles are scattered and deposited on the substrate, whereby it is possible to obtain an oxide superconducting film having high and uniform characteristics. Thus, the present invention is remarkably effective for improving superconductivity of a large-area oxide superconducting film.

Further, the present invention is effective for improving quality of an oxide superconducting film which is formed at a high speed, whereby a particularly excellent effect can be attained when the inventive apparatus is applied to manufacturing of an oxide superconducting wire which is obtained by employing an elongated tape base material as a substrate and continuously forming an oxide superconducting film thereon, for example.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (Embodiment 1)

Figure 1:
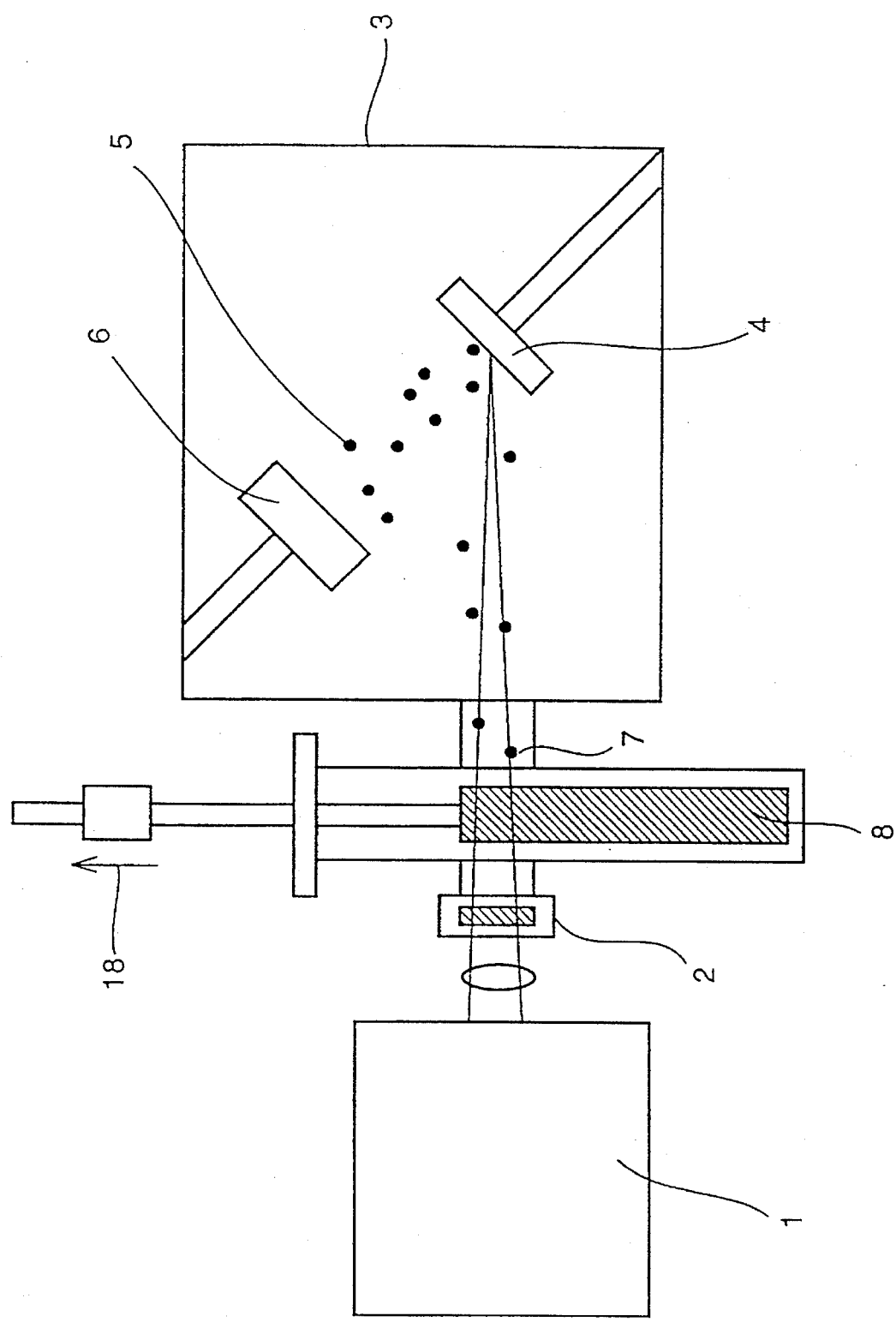
FIG. 1 typically illustrates an oxide superconducting film manufacturing apparatus according to an embodiment of the present invention.

FIG. 1 illustrates an oxide superconducting film manufacturing apparatus according to an embodiment of the present invention.

Referring to FIG. 1, this oxide superconducting film manufacturing apparatus comprises a laser oscillator 1, and a thin film forming chamber 3 having a laser entrance window 2. The thin film forming chamber 3 is provided therein with a target 4 containing components of an oxide superconductor, and a substrate 6 which is arranged to face the target 4. Further, a laser-transparent plate 8 is provided between the laser entrance window 2 and the target 4. The laser-transparent plate 8, which is in the form of a rectangle, can be linearly moved along arrow 18.

The target 4 provided in the thin film forming chamber 3 is irradiated with a laser beam which is emitted from the laser oscillator 1 through the laser entrance window 2. The target 4 contains components of an oxide superconductor. Upon irradiation with the laser beam, particles 5 of the material forming the target 4 are so scattered that the material is deposited on the substrate 6 which is arranged to face the target 4. At this time, the particles of the material forming the target 4 are scattered not only toward the substrate 6 but toward the laser entrance window 2. Such particles 7 being scattered toward the laser entrance window 2 adhere to the laser-transparent plate 8 before reaching the laser entrance window 2. The power of the laser beam which is applied to the target 4 is temporarily reduced by such adhesion of the particles 7. When the laser-transparent plate 8 is linearly moved along arrow 18, however, a clean surface appears in a portion for transmitting the laser beam, thereby recovering the laser power. Such movement of the plate 8 is repeated during film formation. This movement of the plate 8 may be controlled by a timer, or by detecting reduction of the laser power.

Although the plate 8 is intermittently moved in the aforementioned embodiment 1, this plate 8 may alternatively be continuously moved during film formation by reciprocation.

(Embodiment 2)

Figure 2:
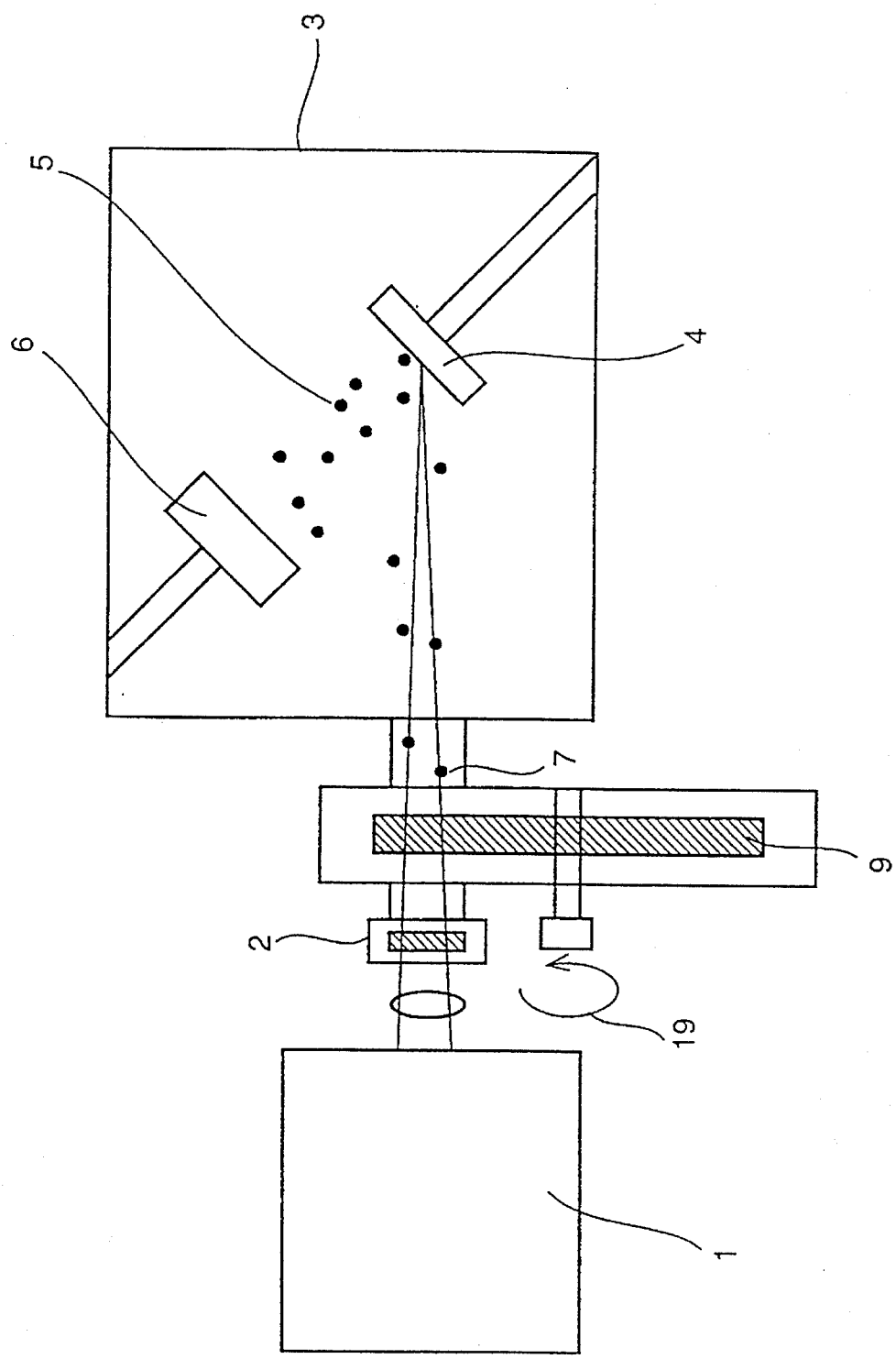
FIGS. 2 to 4 typically illustrate oxide superconducting film manufacturing apparatuses according to other embodiments of the present invention.

FIG. 2 illustrates an oxide superconducting film manufacturing apparatus according to another embodiment of the present invention.

Referring to FIG. 2, this oxide superconducting film manufacturing apparatus comprises a laser oscillator 1, and a thin film forming chamber 3 having a laser entrance window 2 as well as a target 4 and a substrate 6 arranged therein, similarly to the embodiment 1. Further, a laser-transparent plate 9 is provided between the laser entrance window 2 and the target 4. The laser-transparent plate 9, which is in the form of a disk, can be rotated along arrow 19.

Similarly to the embodiment 1, the target 4 is irradiated with a laser beam which is emitted from the laser oscillator 1, whereby particles of the material forming the target 4 are scattered not only toward the substrate 6 but toward the laser entrance window 2. Such particles 7 being scattered toward the laser entrance window 2 adhere to the laser-transparent plate 9 before reaching the laser entrance window 2. The power of the laser beam which is applied to the target 4 is temporarily reduced by such adhesion of the particles 7. When the laser-transparent plate 9 is rotated along arrow 19, however, a clean surface appears in a portion for transmitting the laser beam, thereby recovering the laser power. Such rotation of the plate 9 is intermittently repeated during film formation. This rotation of the plate 9 may be controlled by a timer, or by detecting reduction of the laser power.

Although the plate 9 is intermittently rotated in the aforementioned embodiment 2, this plate 9 may alternatively be continuously rotated during film formation.

(Embodiment 3)

Figure 3:
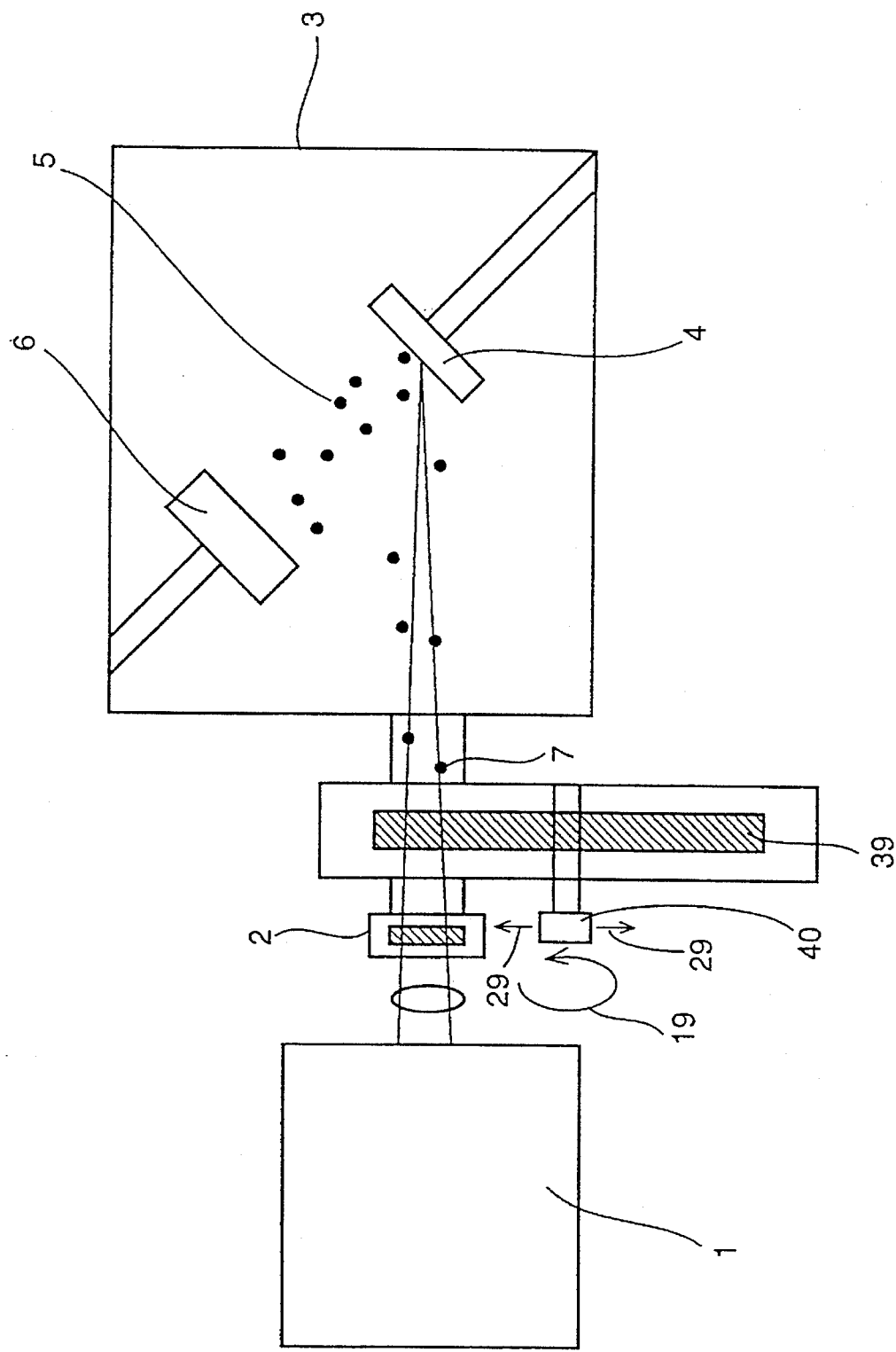

FIG. 3 illustrates an oxide superconducting film manufacturing apparatus according to still another embodiment of the present invention.

Referring to FIG. 3, this oxide superconducting film manufacturing apparatus comprises a laser oscillator 1, and a thin film forming chamber 3 having a laser entrance window 2 as well as a target 4 and a substrate 6 arranged therein, similarly to the embodiment 1. Further, a laser-transparent plate 39 is provided between the laser entrance window 2 and the target 4. The laser-transparent plate 39, which is in the form of a disk, can be rotated along arrow 19 while its rotation axis 40 can be linearly moved along arrow 29.

Similarly to the embodiment 1, the target 4 is irradiated with a laser beam which is emitted from the laser oscillator 1, whereby particles of the material forming the target 4 are scattered not only toward the substrate 6 but toward the laser entrance window 2. Such particles 7 being scattered toward the laser entrance window 2 adhere to the laser-transparent plate 39 before reaching the laser entrance window 2. The power of the laser beam which is applied to the target 4 is temporarily reduced by such adhesion of the particles 7. When the laser-transparent plate 39 is rotated along arrow 19, however, a clean surface appears in a portion for transmitting the laser beam, thereby recovering the laser power.

When the plate 39 is rotated by 360° along arrow 19, the rotation axis 40 of the plate 39 is linearly moved along arrow 29 and thereafter the plate 39 is again rotated. When the plate 39 is thus moved in combination of rotation and linear movement, it is possible to efficiently utilize the overall surface of the discoidal plate 39. Such movement of the plate 39 is intermittently repeated during film formation. This movement of the plate 39 can be controlled by a timer, or by detecting reduction of the laser power.

Although the plate 39 is intermittently moved in the aforementioned embodiment 3, this plate 39 may alternatively be intermittently moved during film formation.

(Embodiment 4)

Figure 4:
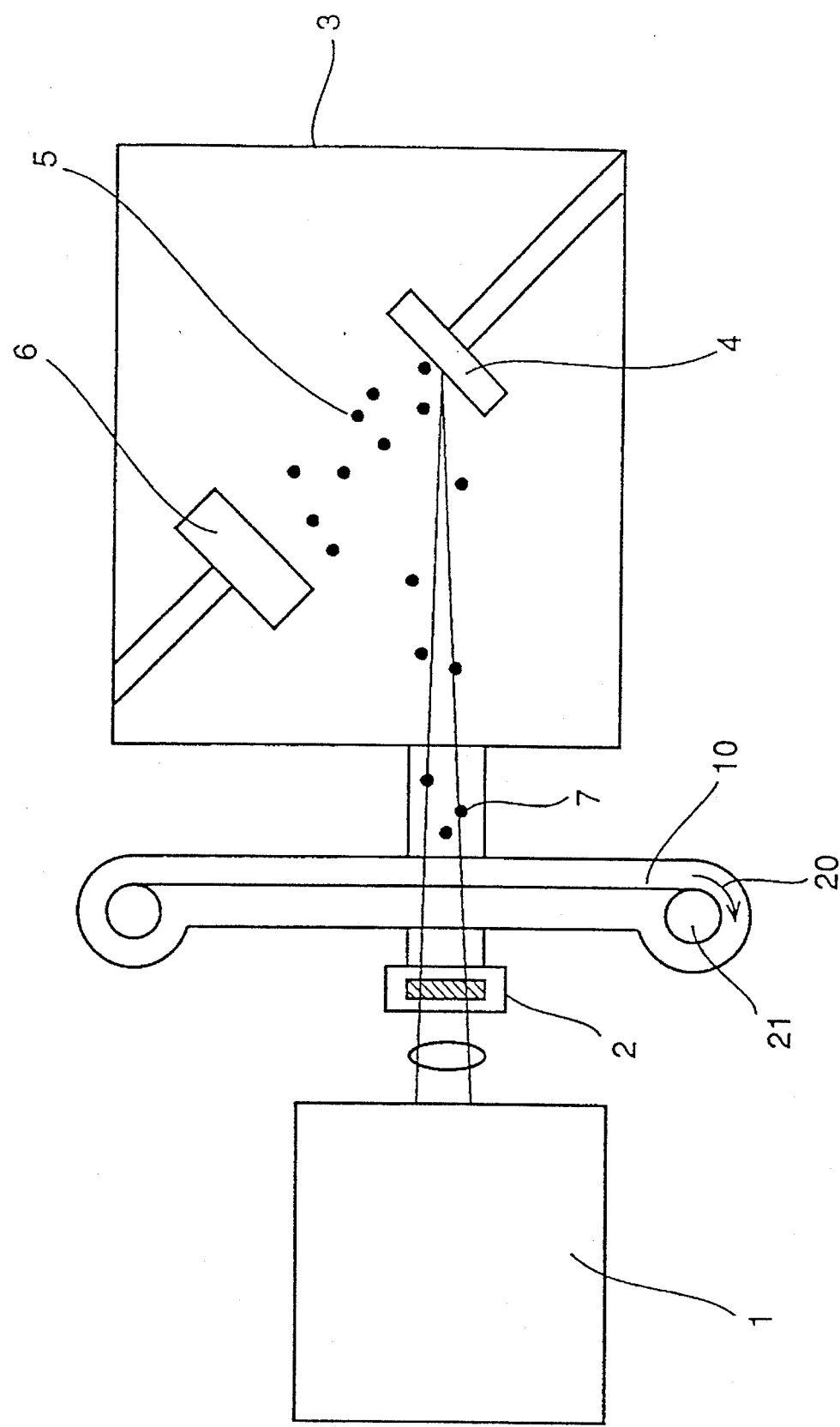

FIG. 4 illustrates an oxide superconducting film manufacturing apparatus according to a further embodiment of the present invention.

Referring to FIG. 4, this oxide superconducting film manufacturing apparatus comprises a laser oscillator 1, and a thin film forming chamber 3 having a laser entrance window 2 as well as a target 4 and a substrate 6 arranged therein, similarly to the embodiment 1. Further, a laser-transparent plate 10 is provided between the laser entrance window 2 and the target 4. The laser-transparent plate 10, which is made of sheet-type quartz, can be moved along arrow 20 by a take-up supply 21.

Similarly to the embodiment 1, the target 4 is irradiated with a laser beam which is emitted from the laser oscillator 1, whereby particles of the material forming the target 4 are scattered not only toward the substrate 6 but toward the laser entrance window 2. Such particles 7 being scattered toward the laser entrance window 2 adhere to the laser-transparent plate 10 before reaching the laser entrance window 2. The power of the laser beam which is applied to the target 4 is temporarily reduced by such adhesion of the particles 7. When the laser-transparent plate 10 is moved by the take-up supply 21 along arrow 20, however, a clean surface appears in a portion for transmitting the laser beam, whereby the laser power is recovered. Such movement of the plate 10 is intermittently repeated during film formation. This movement of the plate 10 may be controlled by a timer, or by detecting reduction of the laser power.

Although the plate 10 is intermittently moved in the aforementioned embodiment 4, this plate 10 may alternatively be continuously moved during film formation.

((Experimental Example 1))

An oxide superconducting manufacturing apparatus having a laser-transparent plate provided between a laser entrance window and a target as in any of the aforementioned embodiments was employed to form a superconducting tape sample while continuously moving the plate during film formation.

A substrate material was prepared from a flexible tape of YSZ (yittria-stabilized-zirconia), which was heated to a temperature of 700° to 750° C. A target was prepared from a $Y_1Ba_2Cu_3O_7$ sintered body. A laser was prepared from an excimer laser of 248 nm in wavelength employing KrF as an excitation gas, with laser energy of 2.5 $J/cm^2$ and a laser frequency of 40 Hz. A film forming atmosphere was prepared from 200 mTorr of oxygen. The tape substrate was carried to continuously form a film.

Figure 6:
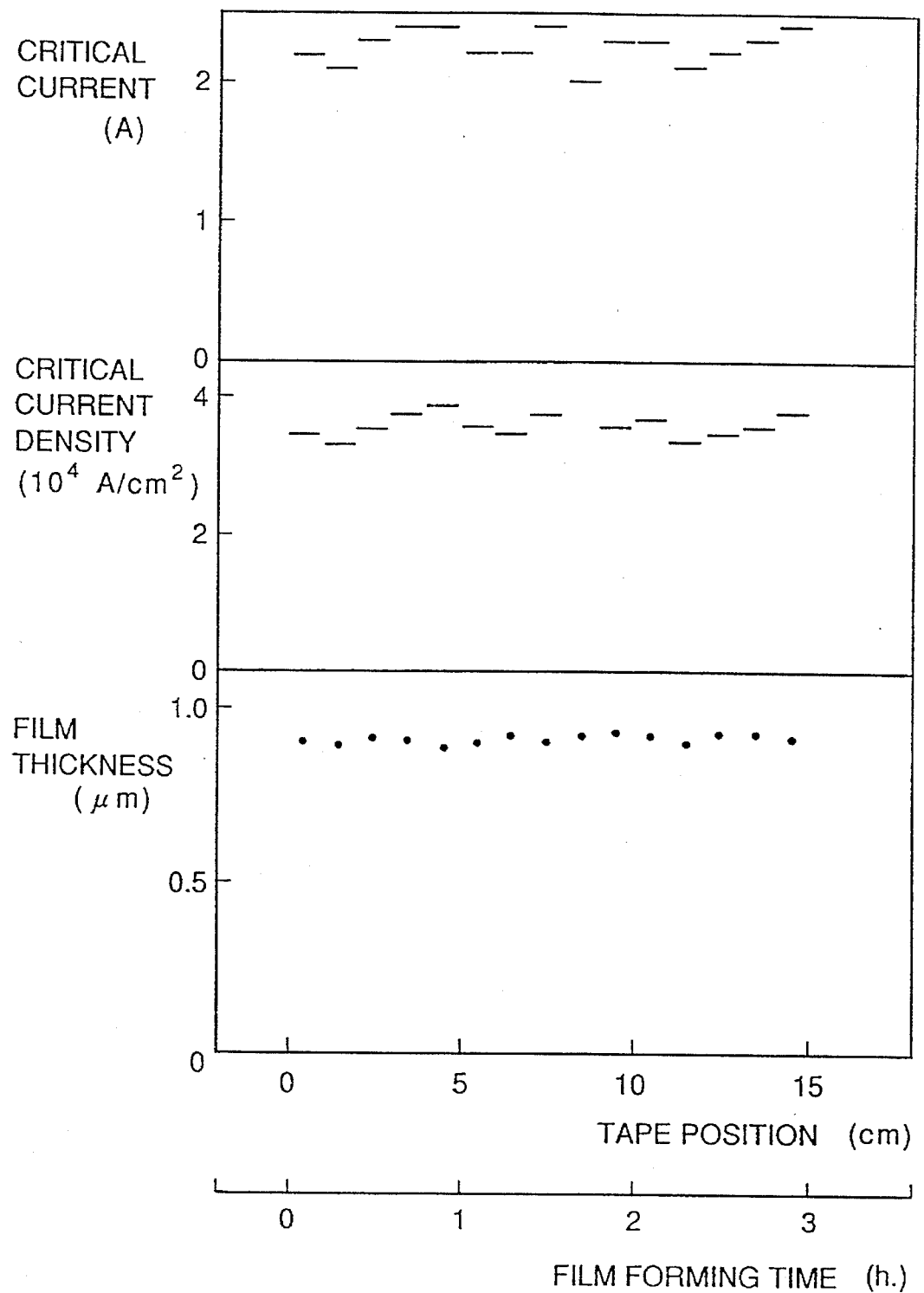
FIG. 6 illustrates distribution of characteristics along the longitudinal direction of an oxide superconducting film manufactured according to the present invention.

FIG. 6 shows distribution of characteristics along the longitudinal direction of the as-obtained oxide superconducting film. Referring to FIG. 6, the axis of abscissas shows positions from a tape head and elapses of the film forming time, while the axis of ordinates shows changes in film thickness and those in critical current density (Jc) and critical current (Ic) at 77.3K respectively.

As clearly understood from FIG. 6, it was confirmed that the film thickness, the critical current density Jc and the critical current Ic were stable along the overall length of the tape in the superconducting tape sample which was formed by the oxide superconducting film manufacturing apparatus having a mechanism for preventing contamination of the laser entrance window.

((Comparative Example))

Figure 5:
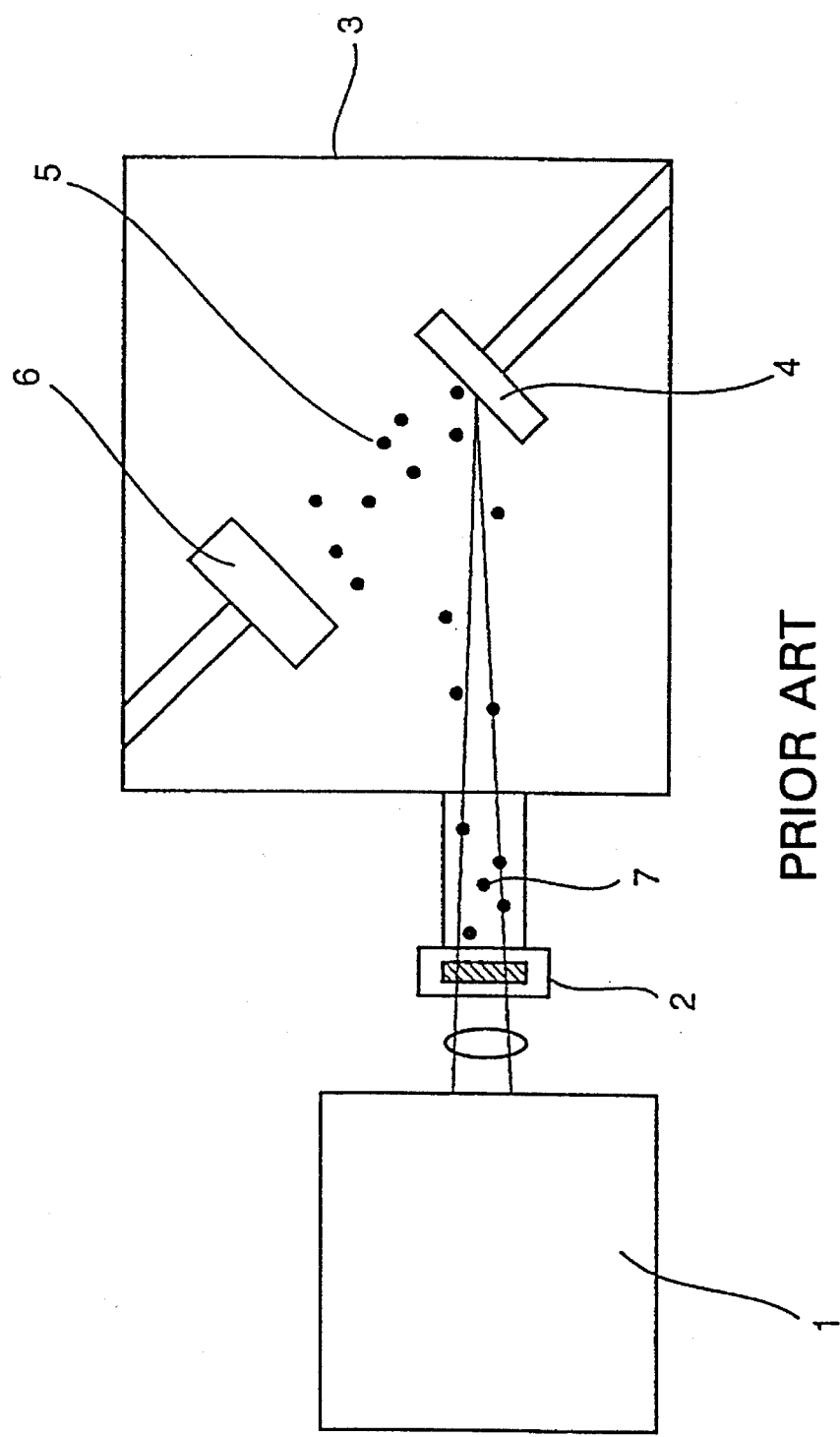
FIG. 5 typically illustrates an example of a conventional oxide superconducting film manufacturing apparatus.

For the purpose of comparison, the conventional oxide superconducting film manufacturing apparatus shown in FIG. 5 was employed to form a superconducting tape sample.

Other film forming conditions were similar to those in Experimental Example 1.

Figure 7:
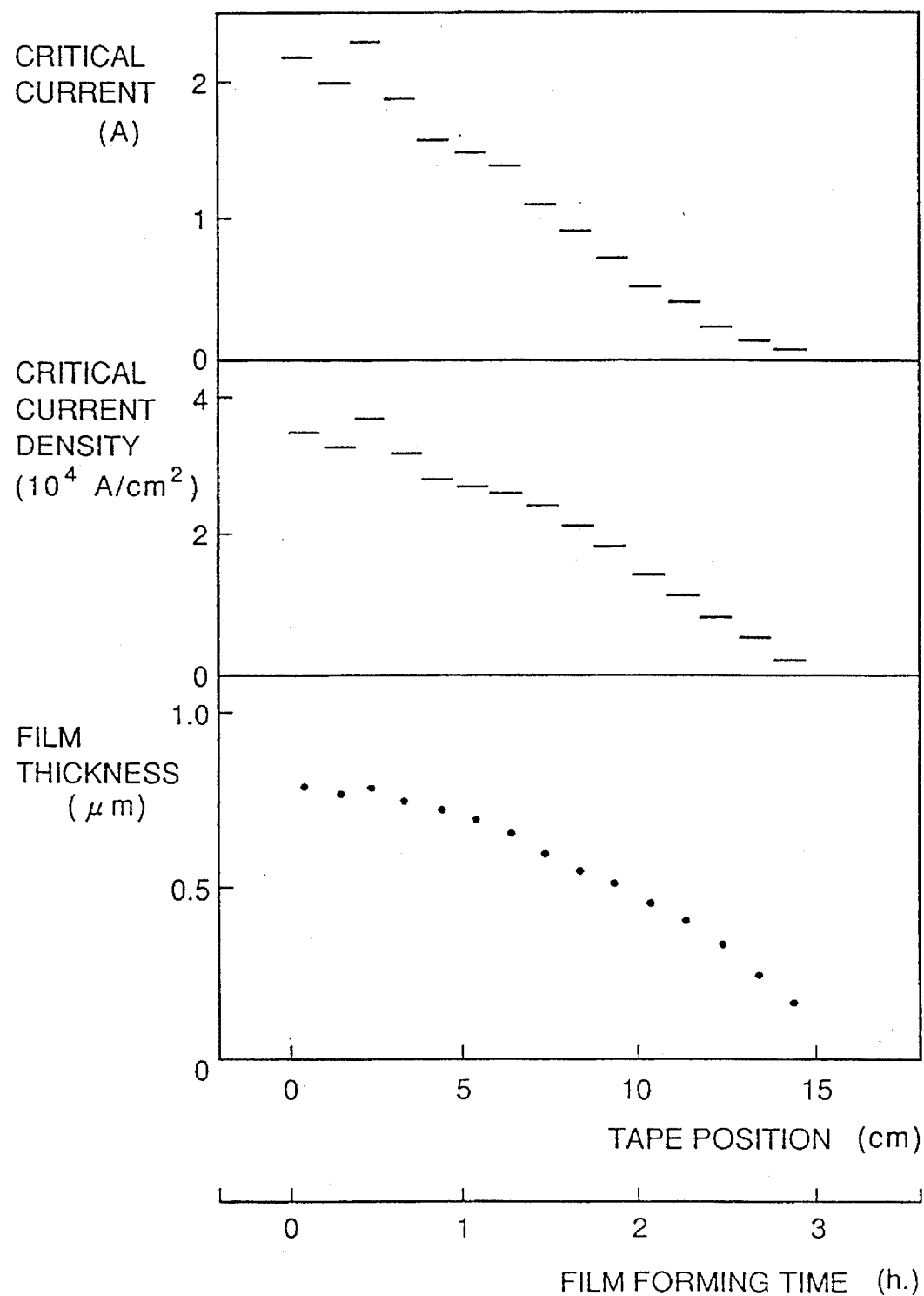
FIG. 7 illustrates distribution of characteristics along the longitudinal direction of an oxide superconducting film manufactured by a conventional method.

FIG. 7 shows distribution of characteristics along the longitudinal direction of the as-obtained oxide superconducting film. Referring to FIG. 7, the axis of abscissas show positions from a tape head and elapses of film forming time, while the axis of ordinates shows changes in film thickness and those in critical current density Jc and critical current Ic at 77.3K respectively.

As clearly understood from FIG. 7, it was confirmed that the film thickness, the critical current density Jc and the critical current Ic were gradually reduced along the longitudinal direction in the superconducting tape sample which was obtained by the conventional apparatus having no mechanism for preventing contamination of a laser entrance window.

(Embodiment 5)

Figure 8:
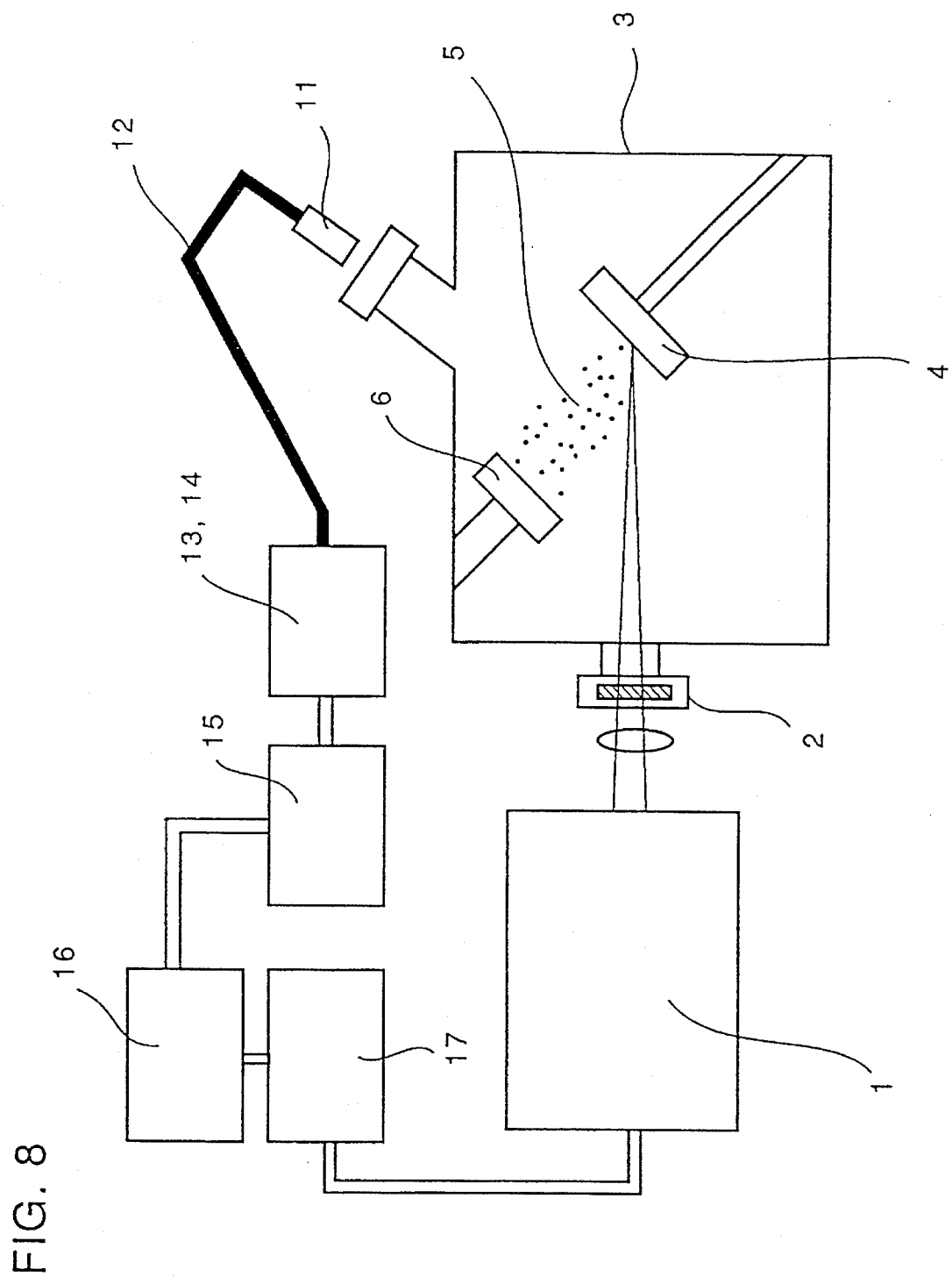
FIG. 8 typically illustrates an oxide superconducting film manufacturing apparatus according to a further embodiment of the present invention.

FIG. 8 shows an oxide superconducting film manufacturing apparatus according to a further embodiment of the present invention.

Referring to FIG. 8, this oxide superconducting manufacturing apparatus comprises a laser oscillator 1, and a thin film forming chamber 3 having a laser entrance window 2. The thin film forming chamber 3 is provided therein with a target 4 containing components of an oxide superconductor, and a substrate 6 which is arranged to face the target 4. The superconducting film manufacturing apparatus further comprises a camera 11 for catching light emitted from scattered particles, a spectroscope 13 for separating the as-caught light into its spectral components, an optical fiber 12 connecting the camera 11 with the spectroscope 13, an amplifier 15 for amplifying an input signal from the spectroscope 13, a computer 16 for transmitting a control signal so that intensity of light emission is constant on the basis of the amplified signal, and a laser control computer 17 for controlling laser power on the basis of the as-received control signal.

The target 4 provided in the thin film forming chamber 3 is irradiated with a laser beam which is emitted from the laser oscillator 1 through a laser entrance window 2. Upon irradiation with the laser beam, particles 5 of the material forming the target 4 are so scattered that the material forming the target 4 is deposited on the substrate 6 which is arranged to face the target 4. At this time, the particles 5 scattered from the target 4 are excited by the high-energy laser beam, to emit light having a specific frequency. This light is caught by the camera 11, and transmitted to the spectroscope 13 through the optical fiber 12. The light which is separated in the spectroscope 13 into its spectral components is converted by a photoelectric element 14 to an electrical signal, which in turn is amplified through the amplifier 15, so that a signal of the spectral data is transmitted to the computer 16. The computer 16, in which light emission intensity $I_0$ from a determined luminous species in starting of film formation is registered, transmits a signal to the laser control computer 17 for controlling the as-received light emission intensity I so that $0.8 \leq I \leq 1.2$ assuming that $I_0=1$. On the basis of the as-received signal, the laser control computer 17 controls an applied voltage to adjust the power of the laser beam emitted from the laser oscillator 1.

((Experimental Example 2)) The oxide superconducting film manufacturing apparatus according to the embodiment 5 was employed to form a superconducting tape sample.

Other film forming conditions were similar to those in Experimental Example 1. Yttrium oxide was employed as a luminous species to be observed.

Table 1 shows changes over time in light emission intensity from yttrium oxide contained in particles being scattered from target in the film formed by the apparatus according to the embodiment 5. The values of light emission intensity were standardized assuming that the level was 1 in starting of film formation.

TABLE 1

| Elapsed Time (h.) | Light Emission Intensity of Yttrium Oxide |
| --- | --- |
| 0 | 1 |
| 0.5 | 0.99 |
| 1.0 | 1.01 |
| 1.5 | 1.02 |
| 2.0 | 0.99 |
| 2.5 | 1.01 |

For the purpose of comparison, Table 2 shows changes over time in light emission intensity from yttrium oxide contained in particles being scattered from target in a film formed by the conventional oxide superconducting film manufacturing apparatus as shown in FIG. 5.

TABLE 2

| Elapsed Time (h.) | Light Emission Intensity of Yttrium Oxide |
| --- | --- |
| 0 | 1 |
| 0.5 | 0.95 |
| 1.0 | 0.83 |
| 1.5 | 0.61 |
| 2.0 | 0.32 |
| 2.5 | 0.10 |

It is understood from Tables 1 and 2 that intensity of light emission from yttrium oxide was stable regardless of elapses of time in the sample manufactured by the oxide superconducting film manufacturing apparatus according to the embodiment 5. It is also understood that intensity of light emission from yttrium oxide was gradually reduced with time in the sample manufactured by the conventional oxide superconducting film manufacturing apparatus.

Figure 9:
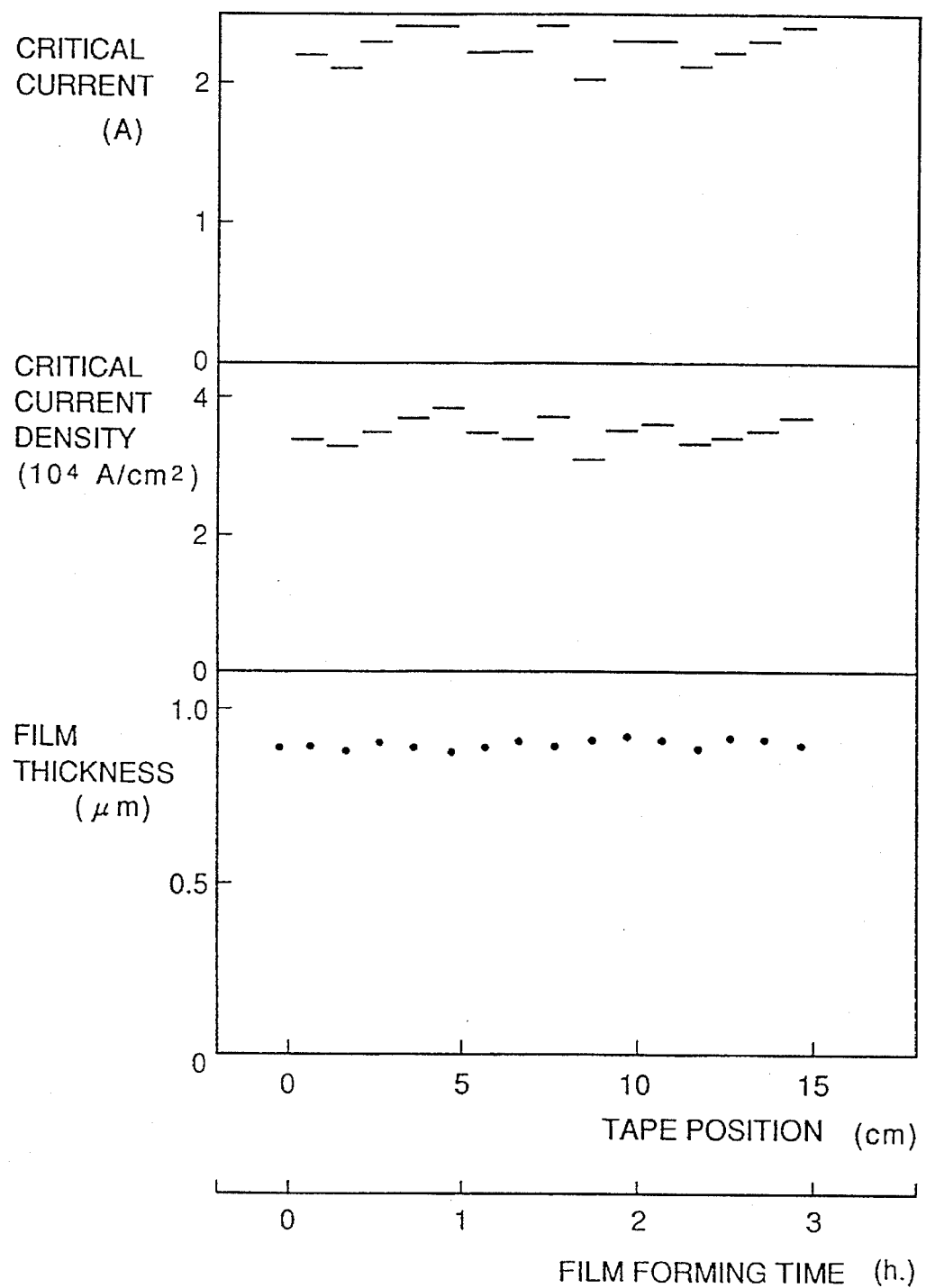
FIG. 9 illustrates distribution of characteristics along the longitudinal direction of an oxide superconducting film manufactured according to the present invention.

FIG. 9 shows distribution of characteristics along the longitudinal direction of the oxide superconducting film formed by the oxide superconducting film manufacturing apparatus according to the embodiment 5. Referring to FIG. 9, the axis of abscissas shows positions from a tape head and elapses of film forming time, while the axis of ordinates shows changes in film thickness and those in critical current density Jc and critical current Ic at 77.3K respectively.

As clearly understood from FIG. 9, it was confirmed that the film thickness, the critical current density Jc and the critical current Ic were stable along the overall length of the tape in the superconducting tape sample manufactured by the oxide superconducting film manufacturing apparatus according to the embodiment 5.

(Embodiment 6)

Figure 10:
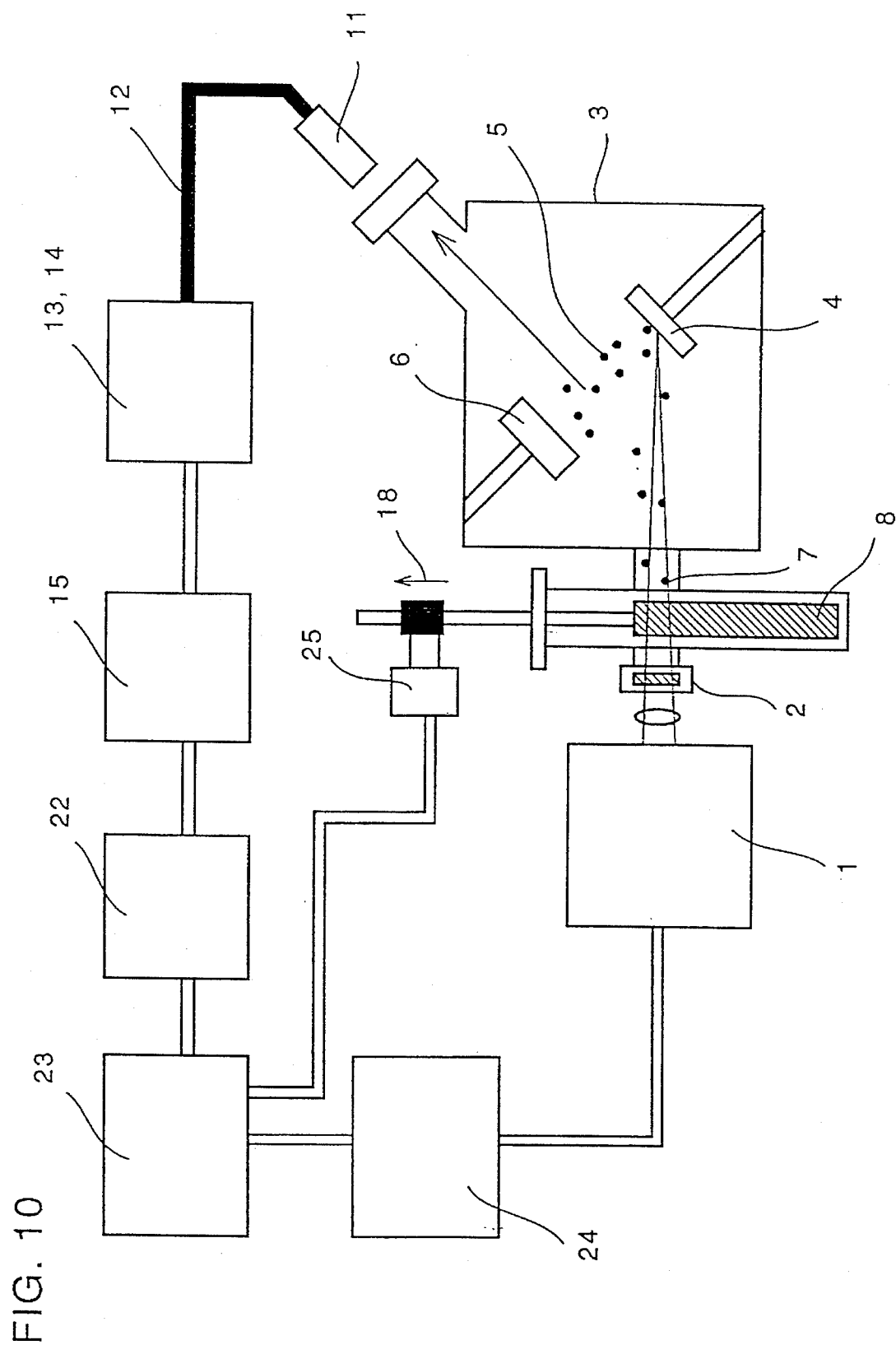
FIG. 10 typically illustrates an oxide superconducting film manufacturing apparatus according to a further embodiment of the present invention.

FIG. 10 illustrates an oxide superconducting film manufacturing apparatus according to a further embodiment of the present invention.

Referring to FIG. 10, this oxide superconducting film manufacturing apparatus comprises a laser oscillator 1, and a thin film forming chamber 3 having a laser entrance window 2. The thin film forming chamber 3 is provided therein with a target 4 containing components of an oxide superconductor, and a substrate 6 which is arranged to face the target 4. Further, a laser-transparent plate 8 is provided between the laser entrance window 2 and the target 4. The laser-transparent plate 8, which is in the form of a rectangle, can be linearly moved along arrow 18. The superconducting film manufacturing apparatus further comprises a camera 11 for catching light emitted from scattered particles, a spectroscope 13 for separating the as-caught light into its spectral components, an optical fiber 12 connecting the camera 11 with the spectroscope 13, an amplifier 15 for amplifying an input signal, a spectral data processing computer 22 for processing the as-amplified signal, a main computer 23 for judging the as-processed spectral data and transmitting a control signal to a laser control computer 24 or a plate carrying driver 25, and the laser control computer 24 for controlling laser power and the plate carrying driver 25 for moving the plate 8 on the basis of the control signal.

Figure 11:
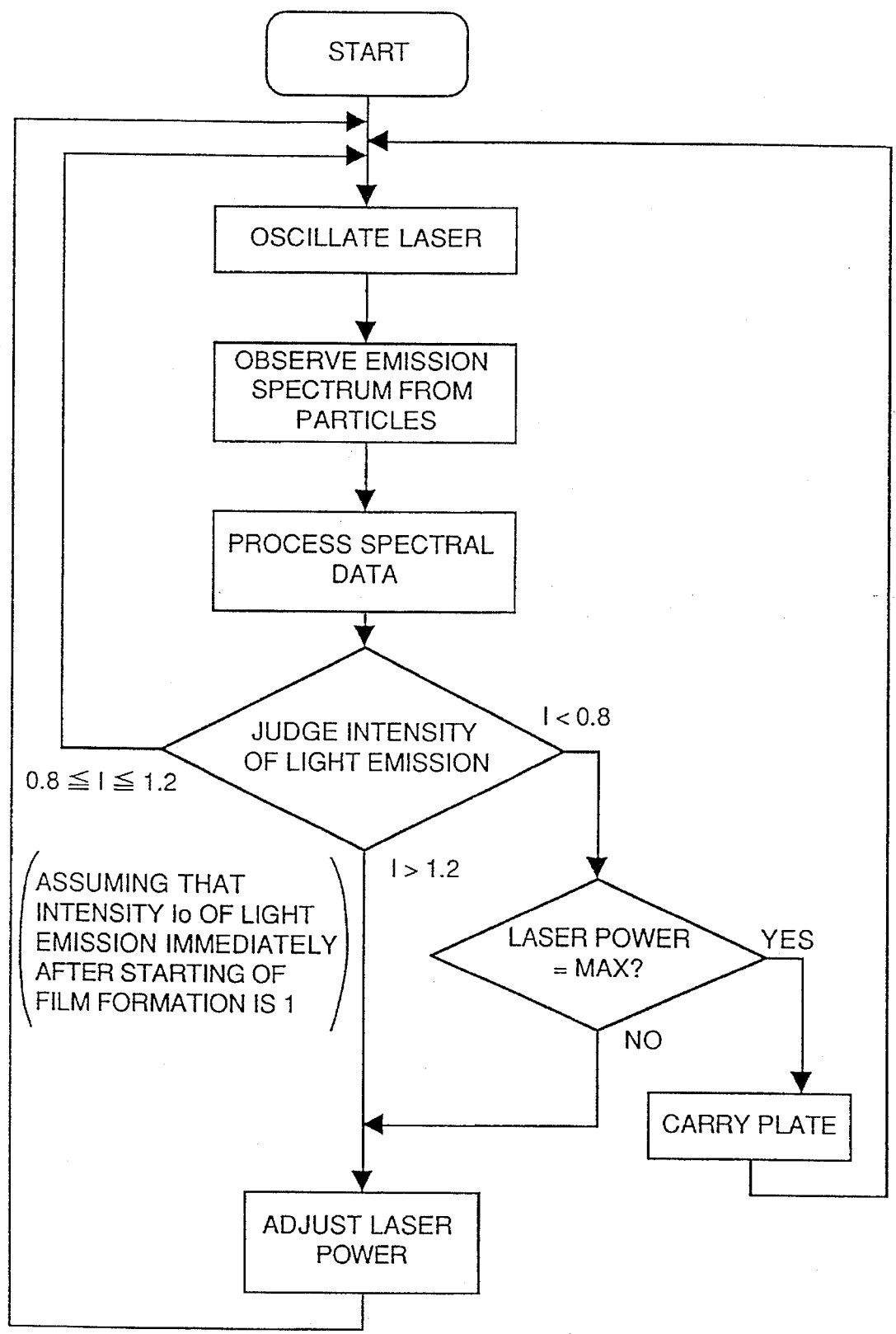
FIG. 11 is a flow chart for illustrating an operation of the oxide superconducting film manufacturing apparatus shown in FIG. 10.

In the oxide superconducting film manufacturing apparatus having the aforementioned structure, automatic control for bringing the laser power into a constant level is carried out in the following manner. FIG. 11 shows a flow chart of this automatic control.

The target 4 provided in the thin film forming chamber 3 is irradiated with a laser beam which is emitted from the laser oscillator 1 through the laser entrance window 2. The target 4 contains components of an oxide superconductor. Upon irradiation with the laser beam, particles 5 of the material forming the target 4 are scattered so that the material forming the target 4 is deposited on the substrate 6 which is arranged to face the target 4. At this time, the particles 5 scattered from the target 4 are excited by the high-energy laser beam, to emit light having a specific frequency. This light emission is caught by the camera 11, and transmitted to the spectroscope 13 through the optical fiber 12. The light which is separated into its spectral components is converted by a photoelectric element 14 to an electrical signal, so that its spectral data is processed by the spectral data processing computer 22 through the amplifier 15. Then, the spectral data is fed to the main computer 23, which in turn judges light emission intensity I from a certain luminous species. When the light emission intensity I is within a range of $0.8 \leq I \leq 1.2$ assuming that light emission intensity $I_0$ immediately after starting of film formation is equal to 1, laser oscillation is continued as such. When $I>1.2$, the laser control computer 24 adjusts the laser power so that the light emission intensity I from the determined luminous species is constant on the basis of the spectral data, to thereafter continue laser oscillation. When $I<0.8$, a further judgement is made as to whether or not the laser power is at the maximum. If the laser power is not at the maximum, the laser control computer 24 adjusts the laser power so that the light emission intensity I from the determined luminous species is constant, to thereafter continue laser oscillation, similarly to the case of $I>1.2$. When the laser power is at the maximum, on the other hand, the plate 8 is linearly moved by the plate carrying driver 25. Thus, a clean surface appears in a portion for transmitting the laser beam, to recover the laser power and to thereafter continue laser oscillation.

Although the rectangular plate 8 is linearly moved in the aforementioned embodiment 6, a discoidal plate such as that shown in FIG. 2 may alternatively be rotated, or a discoidal plate such as that shown in FIG. 3 may be rotated with linear movement of its rotation axis. Further, a sheet-type plate such as that shown in FIG. 4 may be moved by a take-up supply.

(Embodiment 7)

Figure 12:
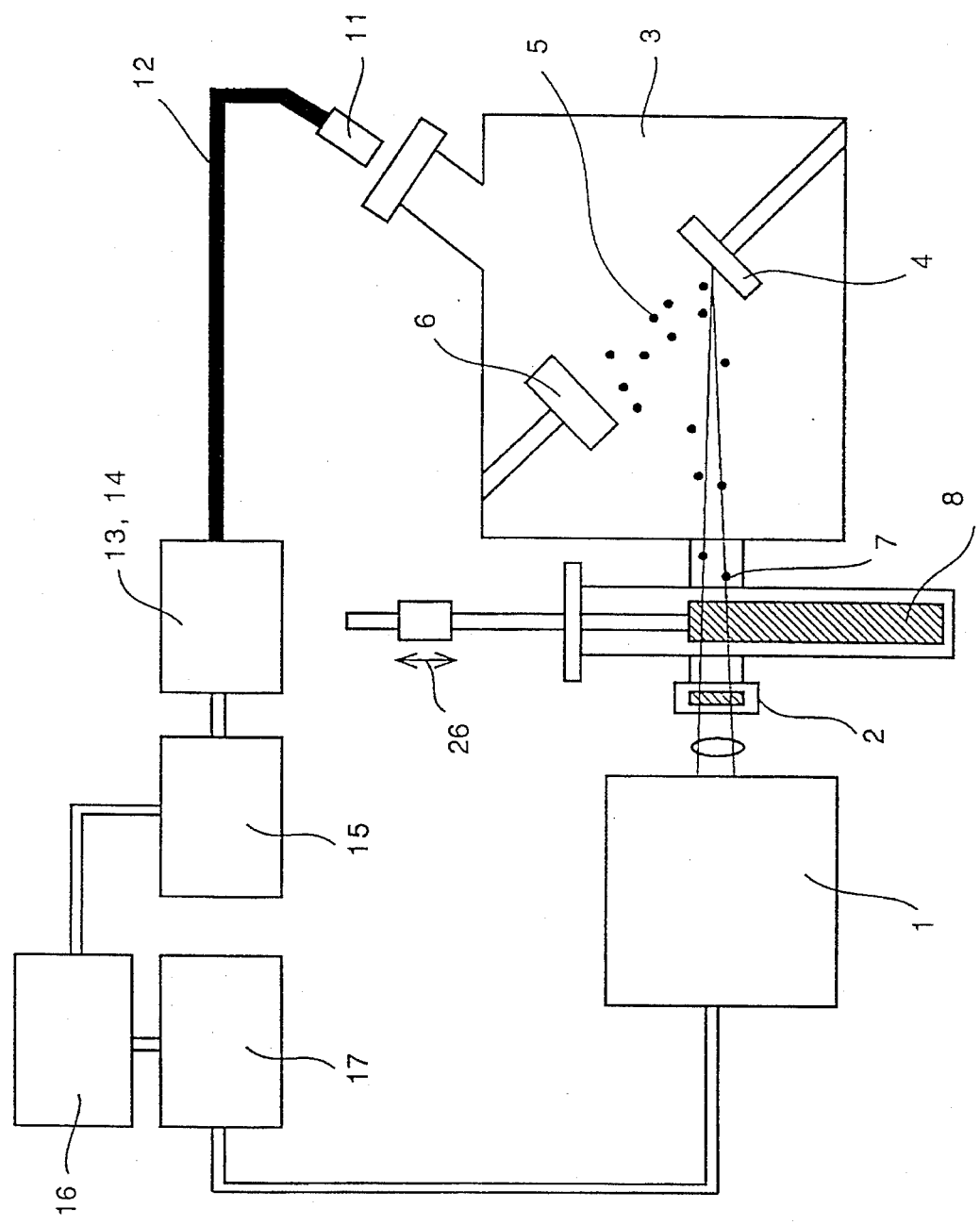
FIG. 12 typically illustrates an oxide superconducting film manufacturing apparatus according to a further embodiment of the present invention.

FIG. 12 illustrates an oxide superconducting film manufacturing apparatus according to a further embodiment of the present invention.

Referring to FIG. 12, this oxide superconducting film manufacturing apparatus comprises a laser oscillator 1, and a thin film forming chamber 3 having a laser entrance window 2. The thin film forming chamber 3 is provided therein with a target 4 containing components of an oxide superconductor, and a substrate 6 which is arranged to face the target 4. Further, a laser-transparent plate 8 is provided between the laser entrance window 2 and the target 4. The laser-transmittance plate 8, which is in the form of a rectangle, can be reciprocated along arrow 26. The superconducting film manufacturing apparatus further comprises a camera 11 for catching light emitted from scattered particles, a spectroscope 13 for separating the as-caught light into its spectral components, an optical fiber 12 connecting the camera 11 with the spectroscope 13, an amplifier 15 for amplifying an input signal from the spectroscope 13, a computer 16 for transmitting a control signal so that intensity of light emission is constant on the basis of the amplified signal, and a laser control computer 17 for controlling laser power on the basis of the as-received control signal.

The target 4 provided in the thin film forming chamber 3 is irradiated with a laser beam which is emitted from the laser oscillator 1 through the laser entrance window 2. Upon irradiation with the laser beam, particles 5 of the material forming the target 4 are scattered so that the material forming the target 4 is deposited on the substrate 6 which is arranged to face the target 4. At this time, the particles scattered from the target 4 are excited by the high energy laser beam, to emit light having a specific frequency. This light emission is caught by the camera 11, and transmitted to the spectroscope 13 through the optical fiber 12. The light separated into its spectral components is converted by a photoelectric element 14 to an electrical signal, which in turn is amplified through the amplifier 15, so that a signal of the spectral data is transmitted to the computer 16. The computer 16, in which light emission intensity $I_0$ from a determined luminous species in starting of film formation is registered, transmits a signal to the laser control computer 17 for controlling the as-received light emission intensity I so that $0.8 \leq I \leq 1.2$ assuming that $I_0=1$. On the basis of the as-received signal, the laser control computer 17 controls an applied voltage to adjust the power of the laser beam which is emitted from the laser oscillator 1.

On the other hand, particles 7 which are scattered toward the laser entrance window 2 adhere to the laser-transparent plate 8 before reaching the laser entrance window 2. When the laser-transparent plate 8 is continuously reciprocated along arrow 26 during film formation, however, it is possible to considerably reduce the speed of the particles 7 adhering to the plate 8, as compared with that in a case with no such reciprocation.

Although the rectangular plate 8 is linearly moved in the aforementioned embodiment 7, a discoidal plate such as that shown in FIG. 2 may alternatively be rotated, or a discoidal plate such as that shown in FIG. 3 may be rotated with linear movement of its rotation axis. Further, a sheet-type plate such as that shown in FIG. 4 may be moved by a take-up supply.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An oxide superconducting film manufacturing apparatus employing laser ablation method, said apparatus comprising:

a thin film forming chamber having a laser-transparent laser entrance window;

a target, being provided in said thin film forming chamber, containing components of an oxide superconductor;

a laser beam source for irradiating said target with a laser beam from the exterior of said thin film forming chamber through said laser entrance window;

first detection means for detecting intensity of light emission from a specific luminous species contained in particles being scattered from said target during film formation;

means for controlling power of said laser beam being emitted from said laser beam source so that said intensity of light emission from said luminous species is constant during film formation in response to a light emission intensity detection output from said first detection means;

second detection means for detecting a control limit of said control means;

a movable laser-transparent plate being provided between said laser entrance window and said target; and means for moving said movable laser-transparent plate in response to a detection output from said second detection means.

2. An oxide superconducting film manufacturing apparatus in accordance with claim 1, wherein said means for moving said movable laser-transparent plate linearly moves said movable laser-transparent plate.

3. An oxide superconducting film manufacturing apparatus in accordance with claim 1, wherein said means for moving said movable laser-transparent plate rotates said movable laser-transparent plate.

4. An oxide superconducting film manufacturing apparatus in accordance with claim 1, wherein said means for moving said movable laser-transparent plate rotates said movable laser-transparent plate while linearly moving its axis of rotation.

5. An oxide superconducting film manufacturing apparatus in accordance with claim 1, wherein said means for moving said movable laser-transparent plate moves a sheet-shaped plate by a take-up supply.

* * * * *